United States Patent
Ku et al.

(10) Patent No.: US 10,067,163 B2
(45) Date of Patent: *Sep. 4, 2018

(54) PROBE CARD CAPABLE OF TRANSMITTING HIGH-FREQUENCY SIGNALS

(71) Applicant: MPI CORPORATION, Hsinchu County (TW)

(72) Inventors: Wei-Cheng Ku, Hsinchu County (TW); Jun-Liang Lai, Hsinchu County (TW)

(73) Assignee: MPI CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,581

(22) Filed: Nov. 9, 2016

(65) Prior Publication Data
US 2017/0059613 A1 Mar. 2, 2017

Related U.S. Application Data

(63) Continuation-in-part of application No. 14/140,294, filed on Dec. 24, 2013, now Pat. No. 9,658,249.

(30) Foreign Application Priority Data

Dec. 26, 2012 (TW) .............................. 101150149 A

(51) Int. Cl.
*G01R 1/067* (2006.01)
*G01R 1/04* (2006.01)

(52) U.S. Cl.
CPC ........... *G01R 1/06772* (2013.01); *G01R 1/04* (2013.01)

(58) Field of Classification Search
CPC .................. G01R 1/07342; G01R 1/06772
See application file for complete search history.

(56) References Cited

U.S. PATENT DOCUMENTS

| | | | |
|---|---|---|---|
| 6,218,910 B1 * | 4/2001 | Miller ................ | G01R 1/06766 324/754.07 |
| 7,388,424 B2 * | 6/2008 | Miller .............. | G01R 31/31716 324/754.07 |
| 9,658,249 B2 * | 5/2017 | Ku ....................... | G01R 1/06772 |
| 2004/0140824 A1 * | 7/2004 | Ji ........................ | G01R 1/07342 324/754.07 |
| 2007/0285085 A1 * | 12/2007 | Strid .................. | G01R 1/06772 324/149 |
| 2010/0117673 A1 * | 5/2010 | Lee ..................... | G01R 1/07378 324/756.03 |
| 2010/0127721 A1 * | 5/2010 | Kuo .................... | G01R 31/2822 324/755.01 |

* cited by examiner

*Primary Examiner* — Son Le
*Assistant Examiner* — Akm Zakaria
(74) *Attorney, Agent, or Firm* — Lynette Wylie; Apex Juris, pllc.

(57) ABSTRACT

A probe card which is capable of transmitting high-frequency signals provided by a DUT, and the DUT includes an output pin group and an input pin group for sending and receiving the high-frequency signals respectively. The probe card includes a first signal pin group, a second signal pin group, and a band circuit. The first signal pin group is made of a conductive material, and is used to contact the output pin group; the second signal pin group is made of a conductive material too, and is used to contact the input pin group; the band circuit is electrically connected to the first signal pin group and the second signal pin group to allow signals within a first bandwidth and a second bandwidth to pass therethrough.

19 Claims, 13 Drawing Sheets

PROBE CARD CAPABLE OF TRANSMITTING HIGH-FREQUENCY SIGNALS

RELATED APPLICATION

This application is a continuation in part of U.S. patent application: Ser. No. 14/140,294 titled "PROBE CARD CAPABLE OF TRANSMITTING HIGH-FREQUENCY SIGNALS", the subject matter thereof being fully incorporated herein by reference.

BACKGROUND OF THE INVENTION

1. Technical Field

The present invention relates generally to probe card, and more particularly to a probe card which is capable of transmitting high-frequency signals.

2. Description of Related Art

Probe cards are applied as transmission interfaces between a tester and a device under test (DUT) to transmit test signals and power signals, which is a widely used method for testing if every electronic component of the DUT is electrically connected correctly.

However, with the advancement of digital technology, the operating speed and the signal throughput of electronic devices are increasing, which make the frequencies of test signals generated by processors of the tester insufficient to satisfy the demand to test such electronic devices. Therefore, in order to solve this problem, the DUT may be utilized to generate high-frequency signals which meet test requirement, and those signals are then transmitted back to the DUT again via probe cards.

Nevertheless, on a conventional probe card, there would be a slight inductance between a conductive wire and a pin while the probe card is transmitting signals, and due to electrical field effects, resistance would increase with higher frequencies of signals transmitted. As a result, the circuit structure of the conventional probe card becomes a low-pass circuit. As shown in FIG. 1 and FIG. 2, the low-pass circuit obstructs high-frequency signals from passing therethrough, and therefore test signals may be not easily recognized by the DUT, which may lead to misjudgment during test procedures. To improve the aforementioned situation, pins with lower inductance would be needed, or the circuit structure would have to be re-designed. These methods would either cost more or increase the complexity of circuits, which is detrimental for maintenance and development in the future.

BRIEF SUMMARY OF THE INVENTION

In view of the above, the primary objective of the present invention is to provide a probe card which is capable of transmitting high-frequency signals effectively.

The present invention provides a probe card capable of transmitting high-frequency signals provided by a device under test (DUT), wherein the DUT includes an output pin group and an input pin group for sending and receiving the high-frequency signals respectively. The probe card includes a first signal pin group, a second signal pin group, and a band circuit, wherein the first signal pin group is made of a conductive material, and is used to contact the output pin group of the DUT; the second signal pin group is made of a conductive material, and is used to contact the input pin group of the DUT; the band circuit is electrically connected to the first signal pin group and the second signal pin group to allow signals within a first bandwidth and a second bandwidth to pass therethrough, and signals beyond the first and the second bandwidths are attenuated or filtered out. More specifically, a lowest frequency of the first bandwidth is 0 Hz, and a highest frequency of the first bandwidth is lower than a lowest frequency of the second band; the high-frequency signals for transmission are within the second bandwidth.

Whereby, once the output pin group of the DUT sends the high-frequency signals, the high-frequency signals are transmitted to the band circuit through the first signal pin group, and then transmitted to the input pin group of the DUT through the second signal pin group.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
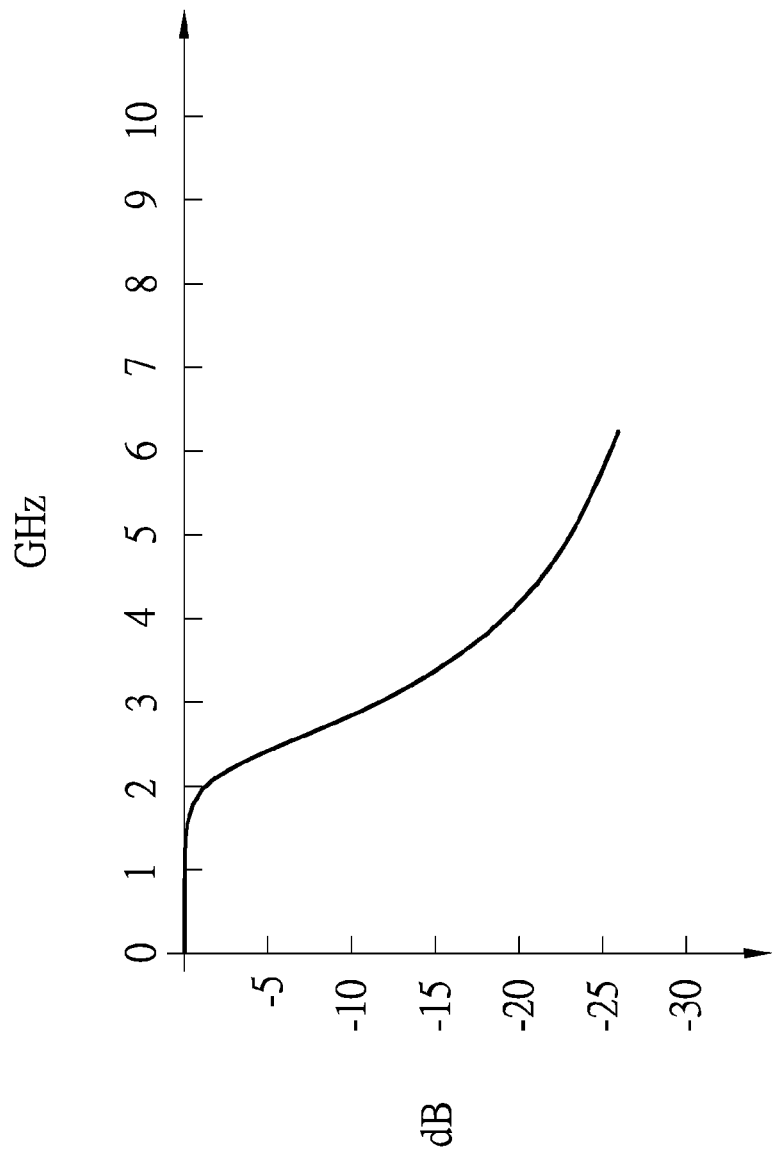
FIG. 1 is a diagram showing the attenuation of signals with different frequencies after the signals passing through the conventional probe card.
Figure 2:
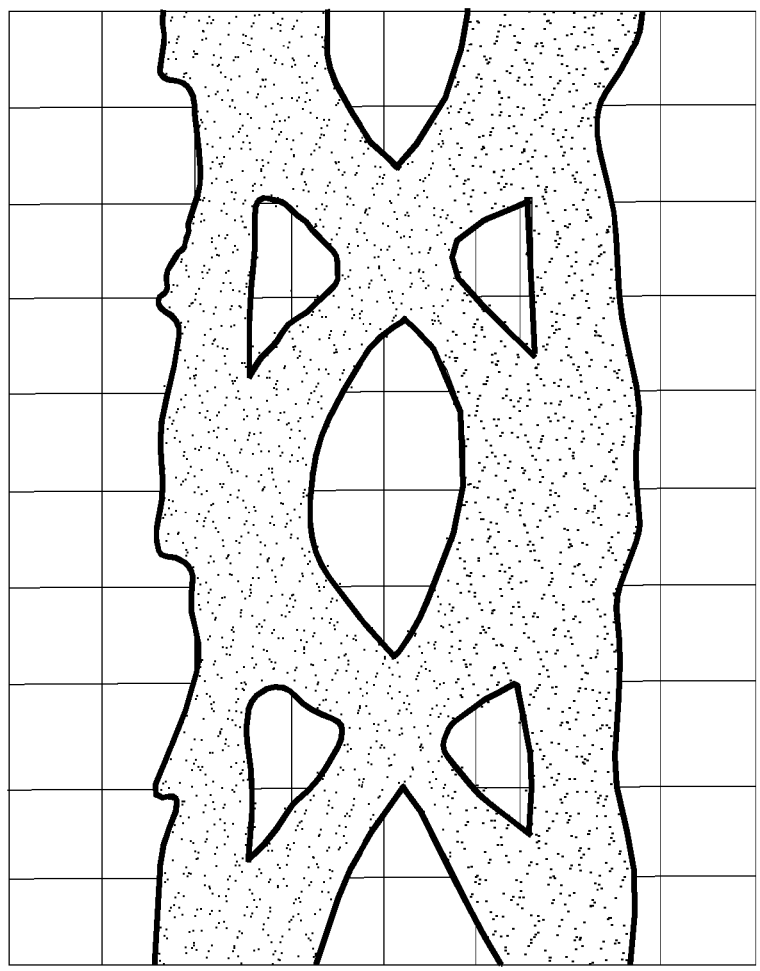
FIG. 2 is an eye diagram of signals passing through the conventional probe card.
Figure 3:
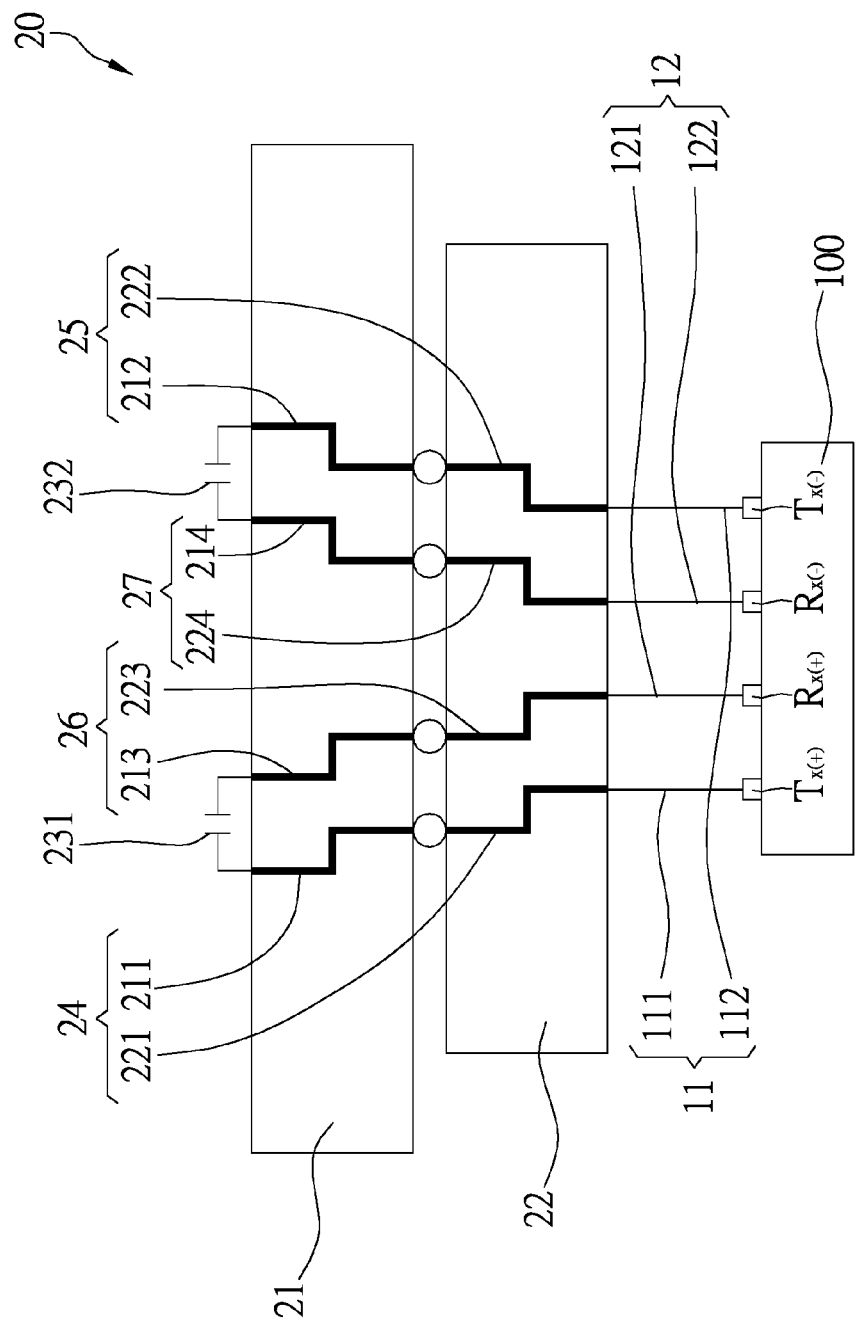
FIG. 3 is a sketch diagram of a first embodiment of the present invention.

As shown in FIG. 3, while a device under test (DUT, such as a processor) 100 is being tested with high signal throughput, the DUT 100 provides high-frequency signals for test purpose, and a probe card of the first preferred embodiment of the present invention is used to transmit those high-frequency signals. For example, if the signal throughput for test is 10G bps in the present preferred embodiment, the high-frequency signals transmitted would be 5G Hz, which is a half of the signal throughput. The DUT 100 has an output pin group and an input pin group, wherein the output pin group is used for sending the high-frequency signals, and the input pin group is used for receiving the high-frequency signals. The output pin group includes a positive output pin Tx(+) and a negative output pin Tx(−), which send positive and negative signals respectively; similarly, the input pin group includes a positive input pin Rx(+) and a negative input pin Rx(−), which receive positive and negative signals respectively. The probe card of the first preferred embodiment of the present invention includes a first signal pin group 11, a second signal pin group 12, and a band circuit 20.

The first signal pin group 11 includes a first positive signal pin 111 and a first negative signal pin 112, which are both made of conductive materials. In more details, the first positive signal pin 111 and the first negative signal pin 112 both have a pin tip and a pin butt, wherein the pin tips of the first positive signal pin 111 and the first negative signal pin 112 are adapted to contact the positive output pin Tx(+) and the negative output pin Tx(−) respectively. Similarly, the second signal pin group 12 includes a second positive signal pin 121 and a second negative signal pin 122, which are both made of conductive materials too. In more details, the second positive signal pin 121 and the second negative signal pin 122 both have a pin tip and a pin butt, wherein the pin tips of the second positive signal pin 121 and the second negative signal pin 122 are adapted to contact the positive input pin Rx(+) and the negative input pin Rx(−) respectively as well.

The band circuit 20 is electrically connected to the first signal pin group 11 and the second signal pin group 12. The major difference between the present invention and the prior art is at the design of the band circuit 20. Since the resistance of the conventional probe card increases with higher frequencies of the signals transmitted, its circuit becomes a low-pass filtering circuit. In other words, such circuit only allows the signals lower than a specific frequency to pass therethrough, and the signals higher than the specific frequency would be greatly attenuated or filtered out. On the contrary, when the band circuit 20 is electrically connected to the first signal pin group 11 and the second signal pin group 12, its circuit structure could allow the signals within a first bandwidth and a second bandwidth to pass therethrough. More specifically, a highest frequency of the first bandwidth is lower than a lowest frequency of the second band. As to the signals beyond the first and the second bandwidths described here, they would be greatly attenuated or filtered out. In an embodiment, the lowest frequency of the first bandwidth is 0 Hz, which allows DC signals for power supplying to pass therethrough. The frequencies of the high-frequency signals are within the second bandwidth, and are preferably to be at middle of the second bandwidth to make sure that the high-frequency signals could pass therethrough successfully. In practice, the highest frequency of the first bandwidth could also equal the lowest frequency of the second bandwidth, so that the first bandwidth and the second bandwidth become a continuous bandwidth together, and other signals out of the bandwidth would be greatly attenuated or filtered out.

Figure 4:
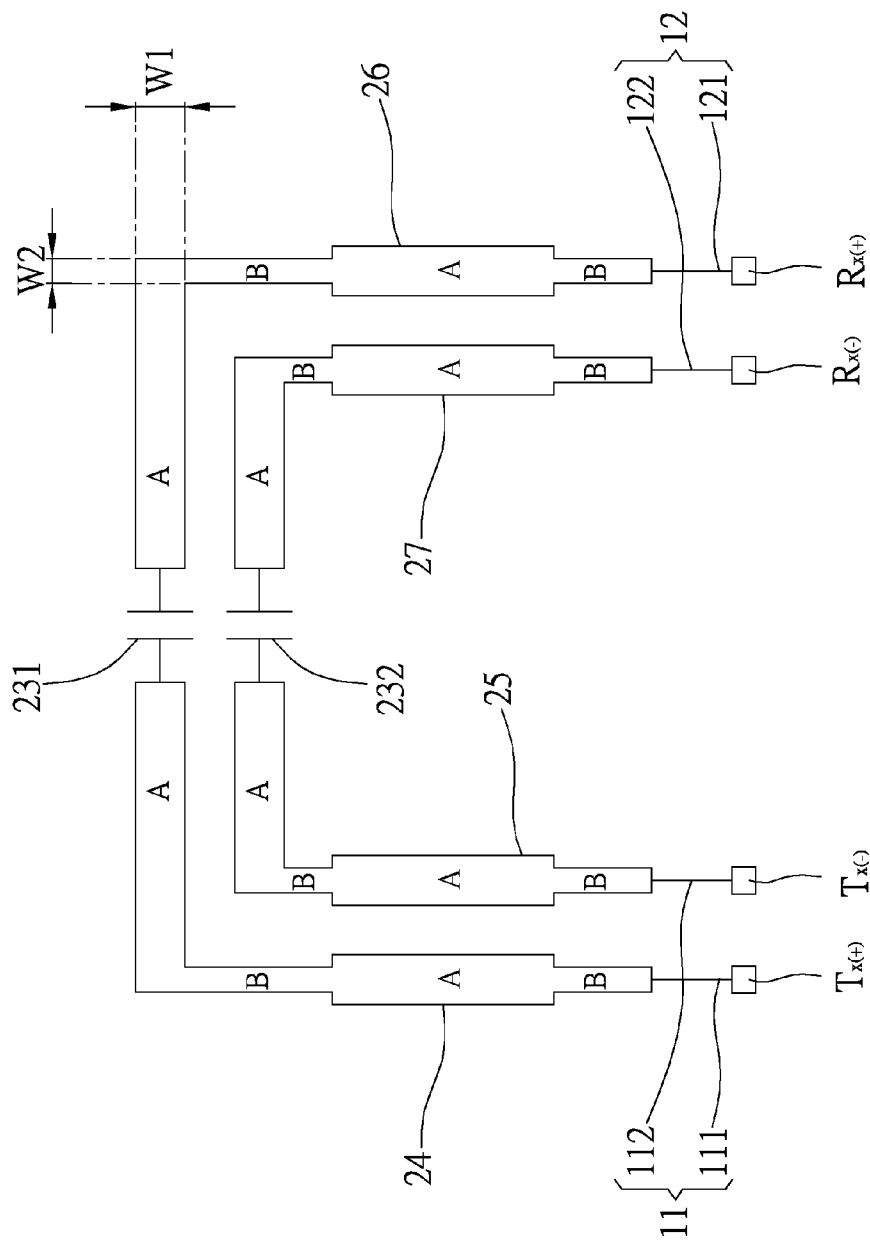
FIG. 4 is a circuit of the first embodiment of the present invention.

In other to achieve the aforementioned function of the band circuit 20, the band circuit 20 includes a circuit substrate 21, a carrier substrate 22, and two capacitors 231, 232 in the present preferred embodiment. There is a circuit layout on the circuit substrate 21 (not shown) to be connected to a tester (not shown). The circuit substrate 21 has a plurality of conductive wires 211-214 therein. The carrier substrate 22 has a plurality of conductive wires 221-224 therein too. A side of the carrier substrate 22 is electrically connected to the circuit substrate 21, while an opposite side thereof touches the first signal pin group 11 and the second signal pin group 12. Therefore, an end of each conductive wire 221-224 is electrically connected to one of the conductive wires 211-214 respectively, and the other end thereof is electrically connected to the pin butt of one of the signal pins 111-112, 121-122 respectively. As shown in FIG. 4, those conductive wires 211-212, 221-222 which are electrically connected to the first signal pin group 11 form a first signal wire group, which includes a first positive signal wire 24 and a first negative signal wire 25, wherein the first positive signal wire 24 includes the conductive wires 211, 221 which are electrically connected to the first positive signal pin 111, and the first negative signal wire 25 includes the conductive wires 212, 222 which are electrically connected to the first negative signal pin 112. Those conductive wires 213-214, 223-224 electrically connected to the second signal pin group 12 form a second signal wire group, which includes a second positive signal wire 26 and a second negative signal wire 27, wherein the second positive signal wire 26 includes the conductive wires 213, 223 which are electrically connected to the second positive signal pin 121, and the second negative signal wire 27 includes the conductive wires 214, 224 which are electrically connected to the second negative signal pin 122. In addition, those signal wires 24-27 all have a first wire segment A and a second wire segment B, which have the following relation:

$W1 \neq W2$; and $W2 \leq 0.9\ W1$;

where $W1$ is a diameter of the first wire segment A, and $W2$ is a diameter of the second wire segment B.

By modifying the diameters of those signal wires 24-27, equivalent capacitance and equivalent inductance of each wire segment A or B could be adjusted. Besides, diameters of the conductive wires 211-214 are different from diameters of the conductive wires 221-224 in the preferred embodiment. In practice, the conductive wires 211-214 and 221-224 could all have segments with different diameters. Moreover, in other embodiments, there could be only either the conductive wires 211-214 or the conductive wires 221-224 to have segments with different diameters.

In the present preferred embodiment, the two capacitors 231, 232 are stand-alone components (in other words, they are physical capacitors) provided on the circuit substrate 21, and are defined as a first capacitor 231 and a second capacitor 232. Two ends of the first capacitor 231 are connected to the first positive signal wire 24 (conductive wire 211) and the second positive signal wire 26 (conductive wire 213) respectively, and two ends of the second capacitor 232 are connected to the first negative signal wire 25 (conductive wire 212) and the second negative signal wire 27 (conductive wire 214) respectively.

Figure 5:
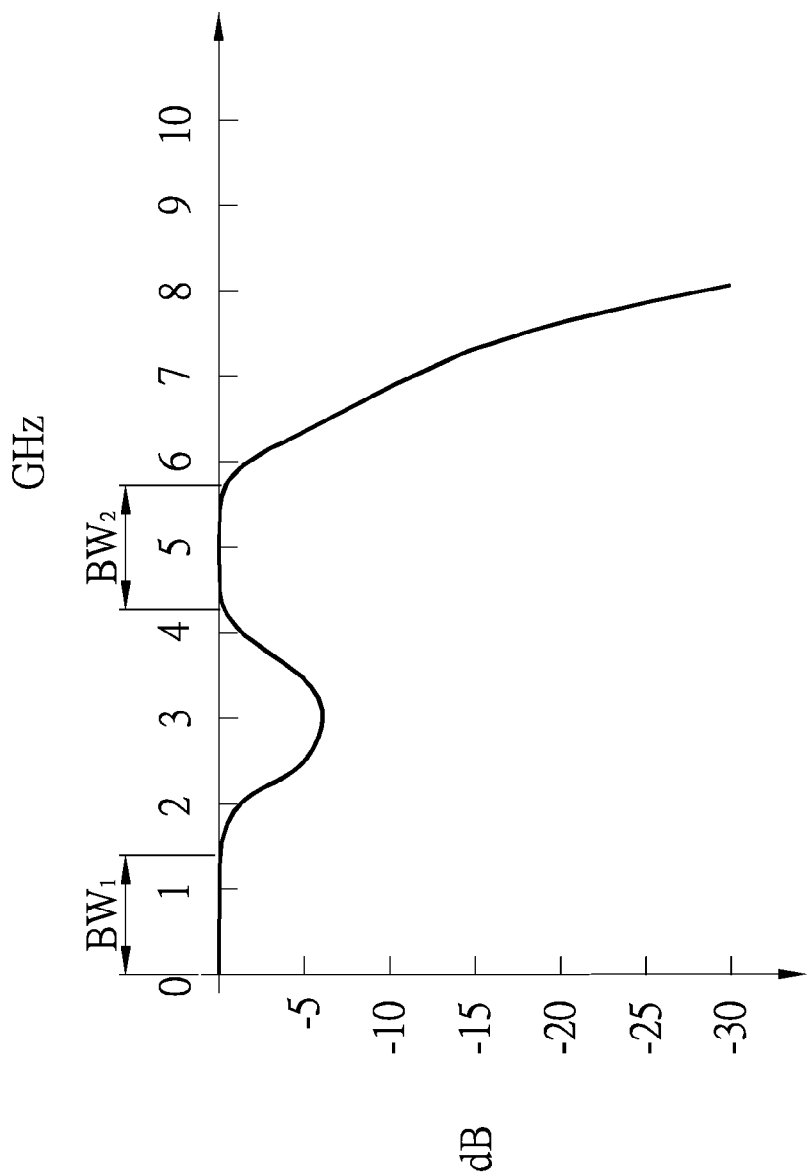
FIG. 5 is a diagram showing the attenuation of signals with different frequencies after the signals passing through the probe card of the first preferred embodiment of the present invention.
Figure 6:
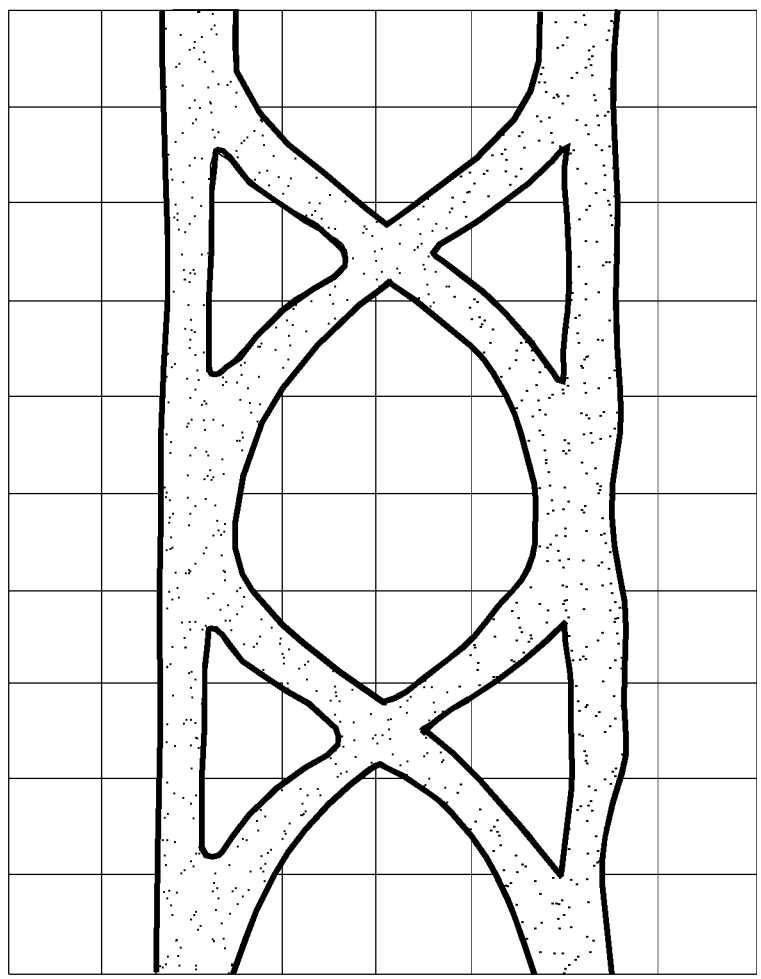
FIG. 6 is an eye diagram of signals passing through the probe card of the first preferred embodiment of the present invention.

In this way, the signal pins 111-112, 121-122, an equivalent capacitance of the wire segments A, B, and an equivalent inductor thereof altogether form an equivalent circuit. With the equivalent circuit and the capacitors 231, 232, the aforementioned function of the band circuit 20 is achieved. Furthermore, as shown in FIG. 5, the band circuit 20 could allow signals within the first bandwidth $BW_1$ (the lowest frequency thereof is 0 Hz) and the second bandwidth $BW_2$ (the frequency of a middle thereof is about 5G Hz) to pass therethrough; signals which are beyond the two bands $BW_1$, $BW_2$ are attenuated or filtered out. As a result, as shown in FIG. 6, after the high-frequency signals passing the probe card, peaks and troughs thereof could still be easily recognized, which could avoid misjudgment during test procedures.

Figure 7:
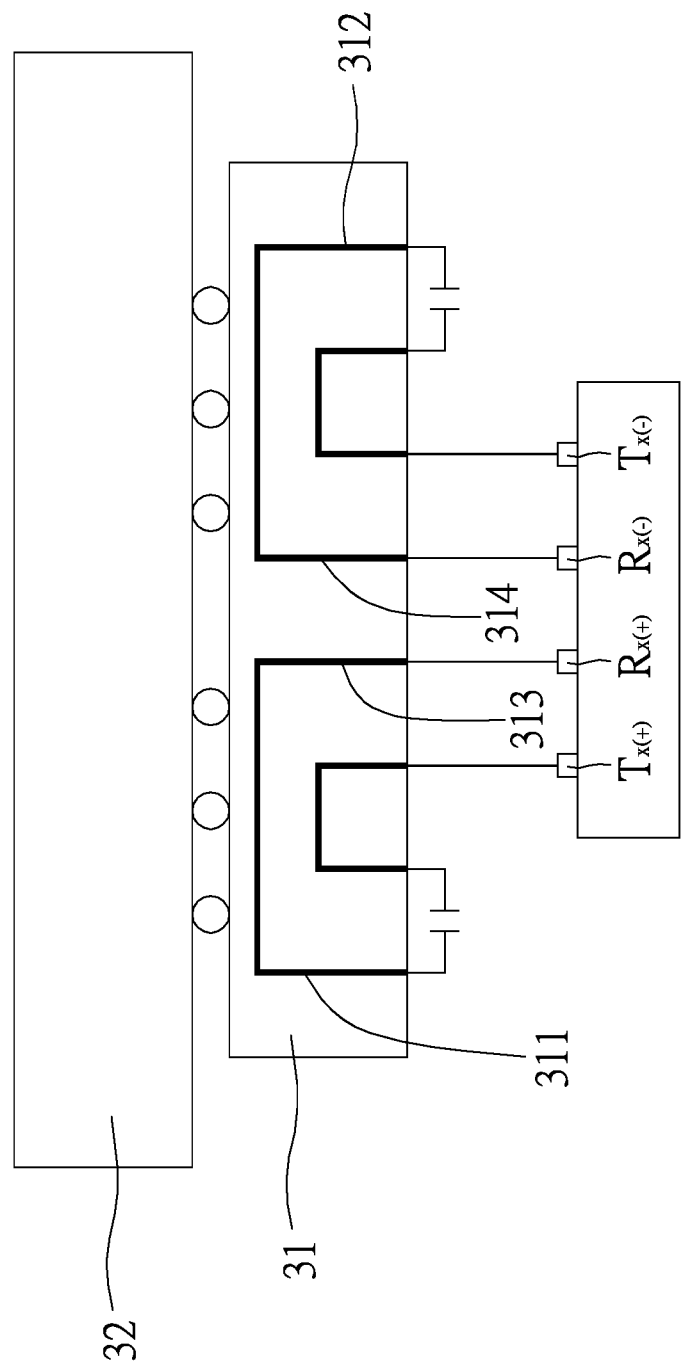
FIG. 7 is a sketch diagram of a second embodiment of the present invention.
Figure 8:
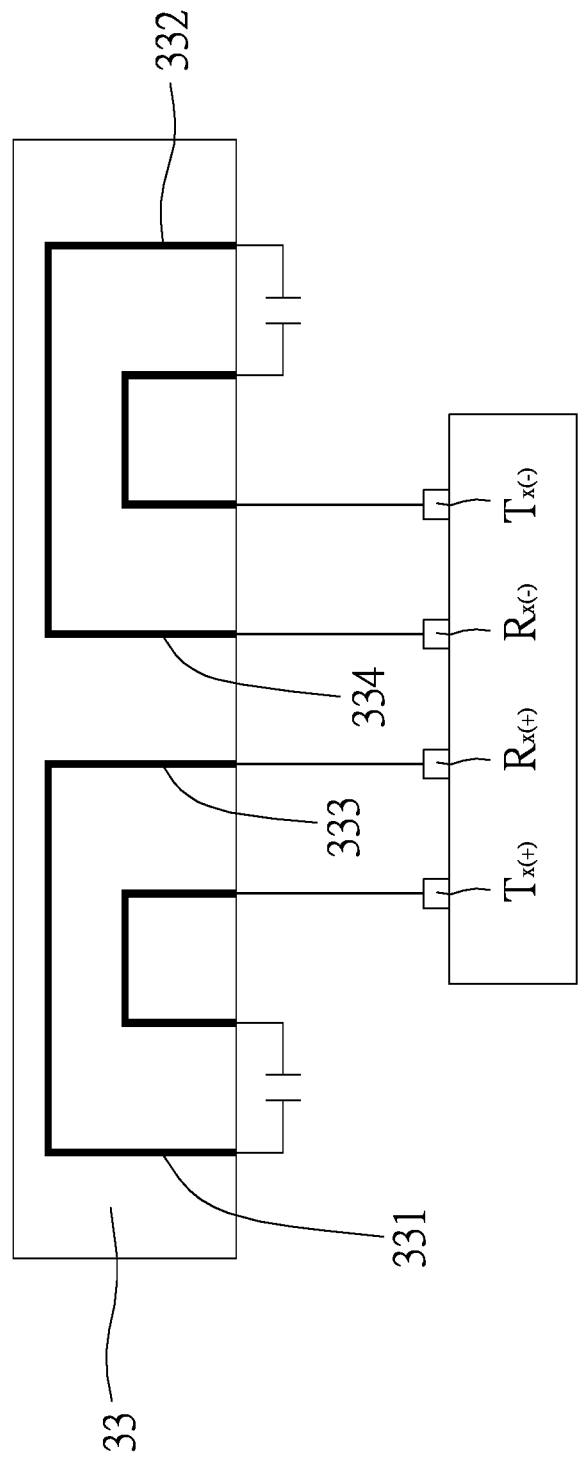
FIG. 8 is a sketch diagram of a third embodiment of the present invention.

In addition to the aforementioned design, the signal wires 311-314 are embedded in the carrier substrate 31 only but not in the circuit substrate 32 in another embodiment, as shown in FIG. 7. Or as shown in FIG. 8, depending on the distances between each pin of the DUT 100, there could be merely the circuit substrate 33 applied with the signal wires 331-334 provided therein in other embodiments. Besides, although the band circuit 20 adopts physical capacitors 231, 232 in the preferred embodiment, embedded capacitors integrated with circuit substrates or carrier substrates could provide the same function as well. Furthermore, though the wire segments A have the same diameters while the wire segments B have other same diameters in the preferred embodiment to adjust the equivalent capacitance and the equivalent inductance, there could be more than three different diameters along each signal wire 24-27 in practice. Needless to say, though the band circuit 20 of the preferred embodiment allows signals within two bandwidths to pass therethrough, band circuits in other embodiments could allow signals within more than three bandwidths to pass therethrough by modifying designs as needed.

Figure 9:
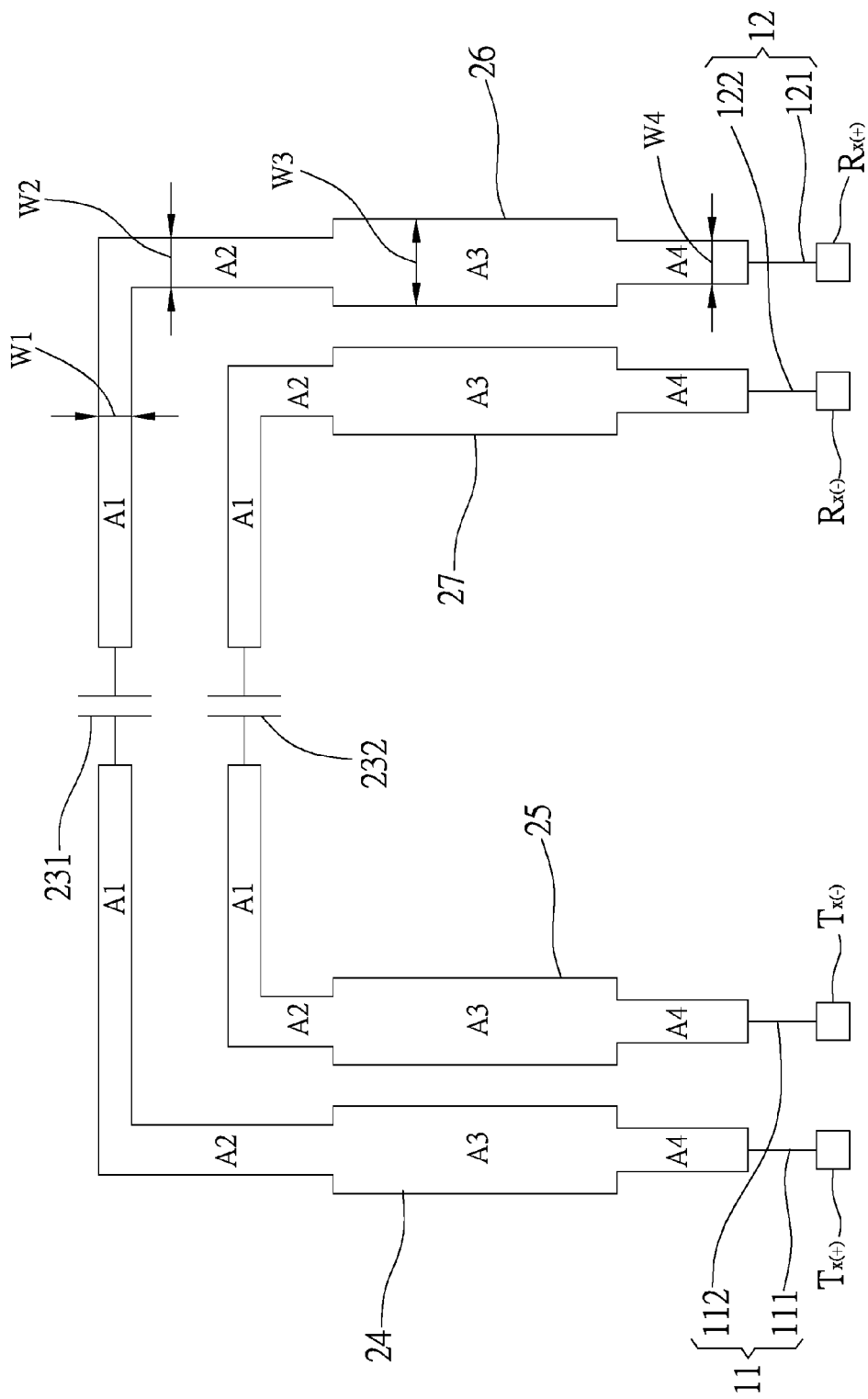
FIG. 9 is a circuit of a fourth embodiment of the present invention.

FIG. 9 is the circuit of a band circuit of the fourth embodiment, which has roughly the same structure with that of the first embodiment, except that the highest frequency of the first bandwidth equals the lowest frequency of the second bandwidth. In other words, the first bandwidth and the second bandwidth together are a continuous bandwidth, and other signals out of the bandwidth would be greatly attenuated or filtered out. Each of the signal wires 24-27 respectively includes a plurality of wire segments, diameters of each two connected wire segments are different. In the fourth embodiment, wire segments of each of the signal wires 24-27 include a first wire segment A1, a second wire segment A2, a third wire segment A3, and a fourth wire segment A4, which are electrically connected sequentially. The first wire segment A1 electrically connects the corresponding one of the capacitors 231, 232 and the second wire segment A2. These wire segments have the following conditions:

$W1<W2$;
$W3 \geq W1$, and $W3 \neq W2$;
$W4 \geq W1$, and $W4 \neq W3$;

In the fourth embodiment: $W3>W2>W4>W1$.

Where W1-W4 are, respectively, diameters of the first to the fourth wire segments A1-A4.

Through the different diameters of the wire segments of the signal wires 24-27, the equivalent capacitance and equivalent inductance of each of the signal wires 24-27 could be adjusted to greatly attenuate or filter out signals out of the bandwidth.

Figure 10:
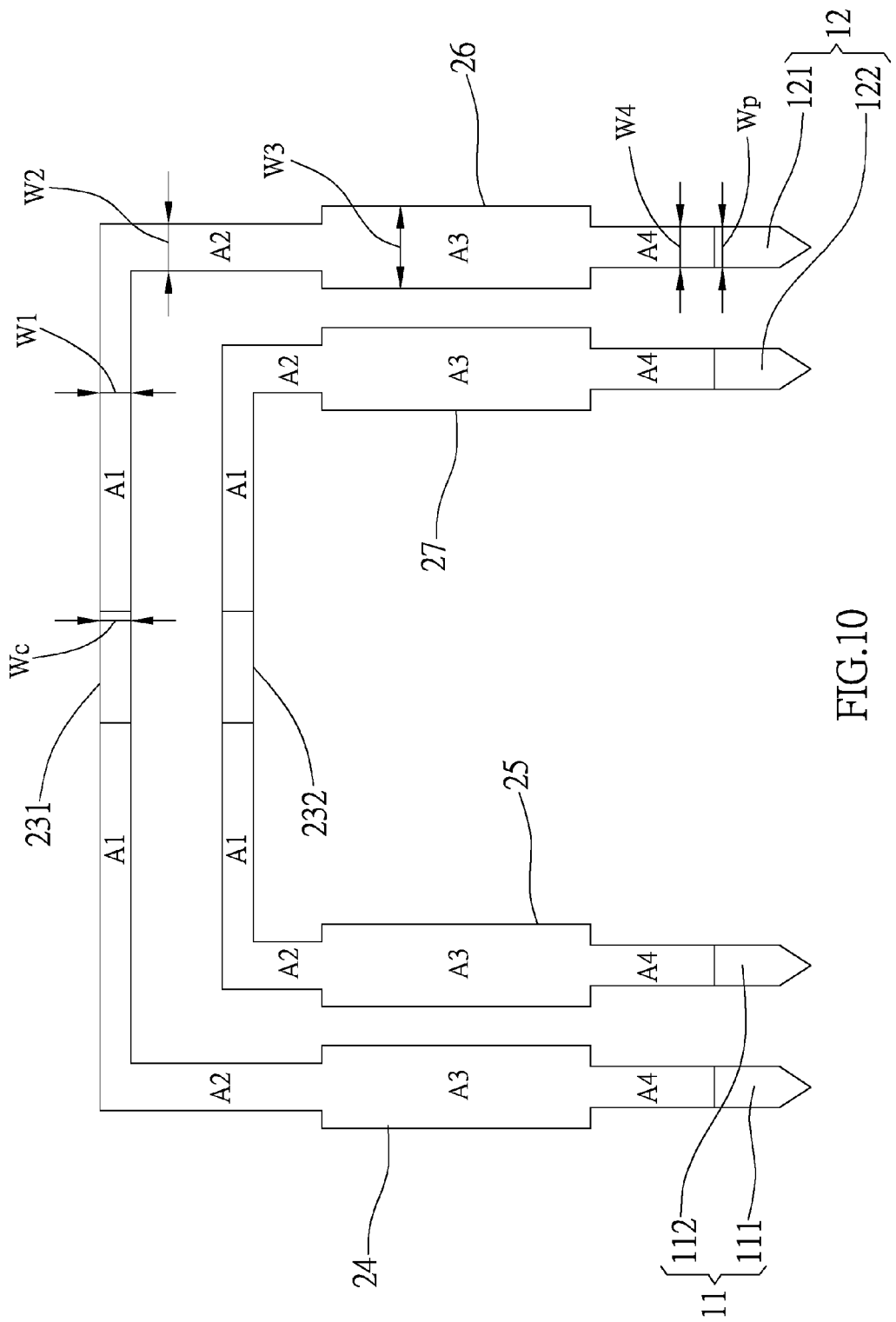
FIG. 10 is a circuit of the fourth embodiment of the present invention, showing the relation between the width of each end of the capacitor, the width of the pin butt of the corresponding signal pin, and the diameter of the connected wire segment.

Also, as shown in FIG. 10, a width Wc of each end of each of the capacitors 231, 232 equals a diameter W1 of the first wire segment A1 connected thereto, so that the connection therebetween would be as fit as possible. In this way, the resistance at the connected portion between each end of each of the capacitors 231, 232 and the corresponding first wire segment A1 would be consistent with the resistance on said first wire segment A1. On the other hand, a width Wp of the pin butt of each of the signal pins 111, 112, 121, 122 equals a diameter W4 of the fourth wire segment A4 connected thereto, so that the connection therebetween would be as fit as possible. In this way, the resistance at the connected portion between the pin butt of each of the signal pins 111, 112, 121, 122 and the corresponding fourth wire segment A4 would be consistent with the resistance on said fourth wire segment A4. In practice, each end of the capacitors 231, 232 could be slightly less than the diameter W1 of the first wire segment A1 connected thereto, and the width Wp of the pin butt of each of the signal pins 111, 112, 121, 122 could be slightly less than the diameter W4 of the fourth wire segment A4 connected thereto.

Figure 11:
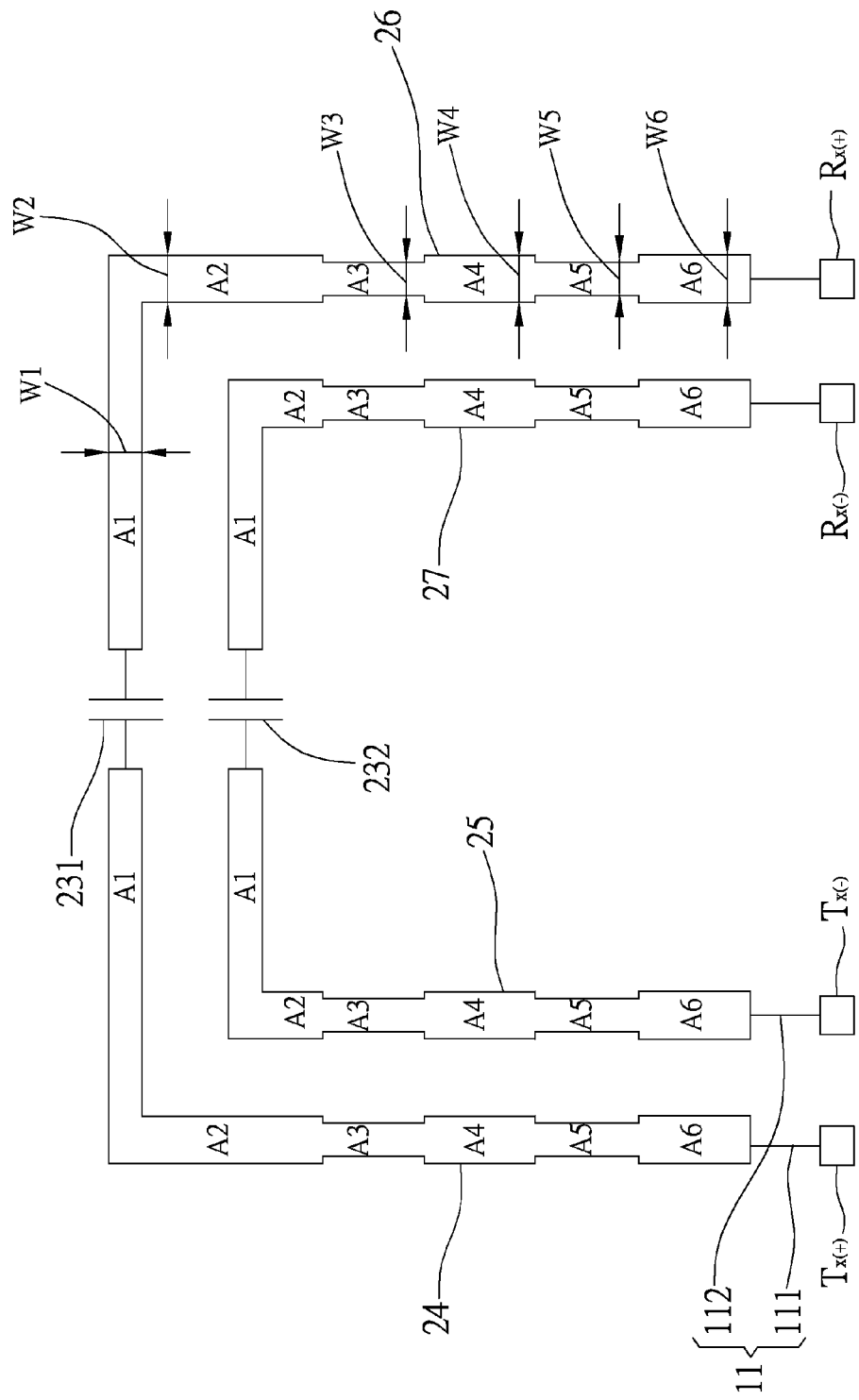
FIG. 11 is a circuit of a fifth embodiment of the present invention.

The circuit of the band circuit of the fifth embodiment of the present invention is illustrated in FIG. 11, which has roughly the same structure with that of the fourth embodiment, except that, in the fifth embodiment, the wire segments of each of the signal wires 24-27 includes a first wire segment A1, a second wire segment A2, a third wire segment A3, a fourth wire segment A4, a fifth wire segment A5, and a sixth wire segment A6, which are electrically connected sequentially. These wire segments have the following relation:

$W1<W2$;
$W1=W3=W5$;
$W2=W4=W6$.

Where, W1-W6 are, respectively, a diameter of the first to the sixth wire segments A1-A6. In other words, each of the signal wires 24-27 has two different diameters (i.e., the values of W1 and W2) for different wire segments, and these two different diameters are repeated for at least once along the relevant signal wires 24-27.

Whereby, signals out of the bandwidth could be also greatly attenuated or filtered out.

Figure 12:
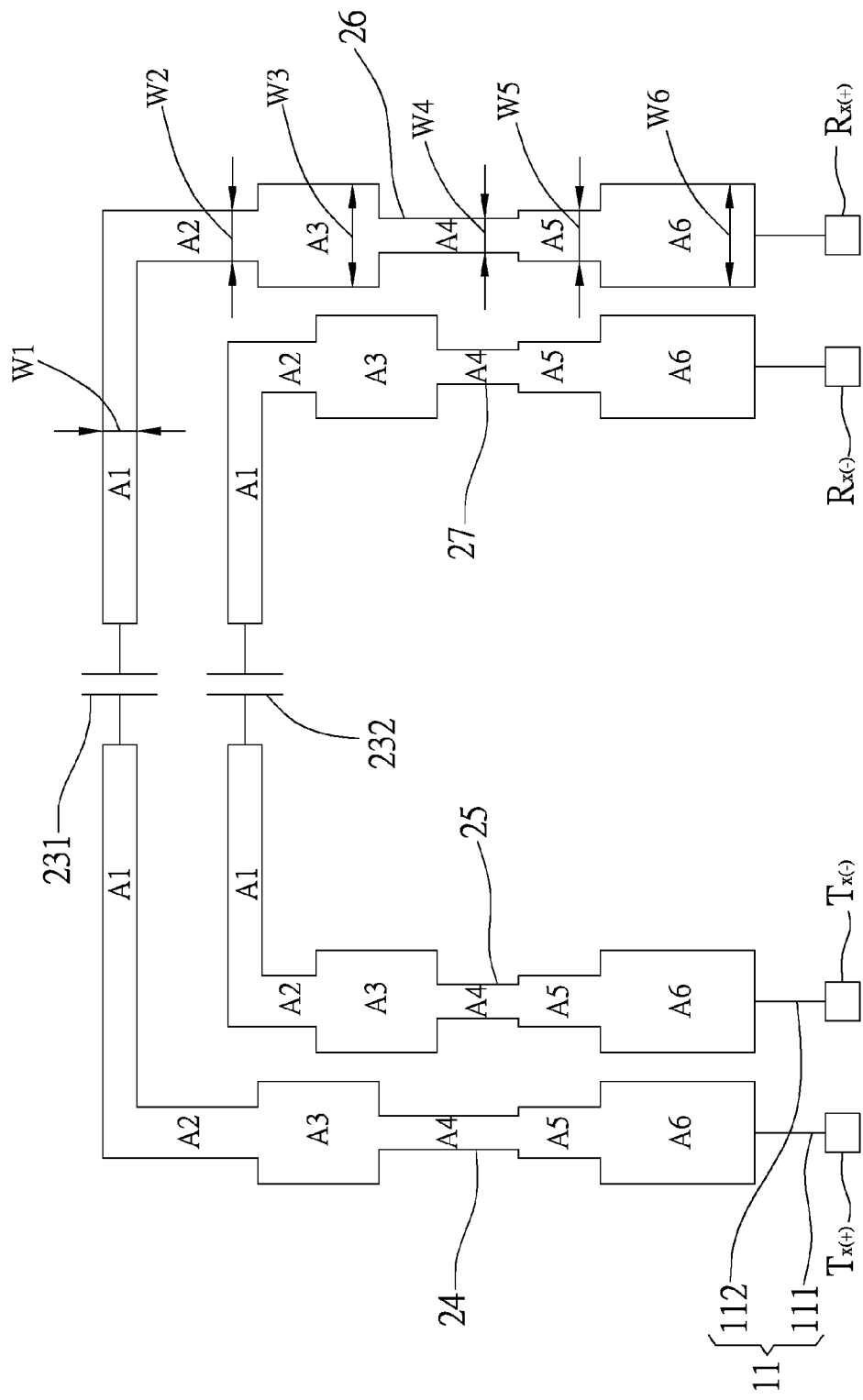
FIG. 12 is a circuit of a sixth embodiment of the present invention.

The circuit of the band circuit of the sixth embodiment of the present invention is shown in FIG. 12, which has roughly the same structure of that of the fifth embodiment, except that, in the sixth embodiment, the wire segments of each of the signal wires 24-27 includes a first wire segment A1, a second wire segment A2, a third wire segment A3, a fourth wire segment A4, a fifth wire segment A5, and a sixth wire segment A6, which are electrically connected sequentially. These wire segments have the following relation:

$W3>W2>W1$;
$W1=W4$; $W2=W4$; $W3=W5$.

Where, W1-W6 are, respectively, a diameter of the first to the sixth wire segments A1-A6. In other words, each of the signal wires 24-27 has three different diameters (i.e., the values of W1, W2, and W3) for different wire segments, and these three different diameters are repeated for at least once along the relevant signal wires 24-27.

Whereby, signals out of the bandwidth could be also greatly attenuated or filtered out.

Figure 13:
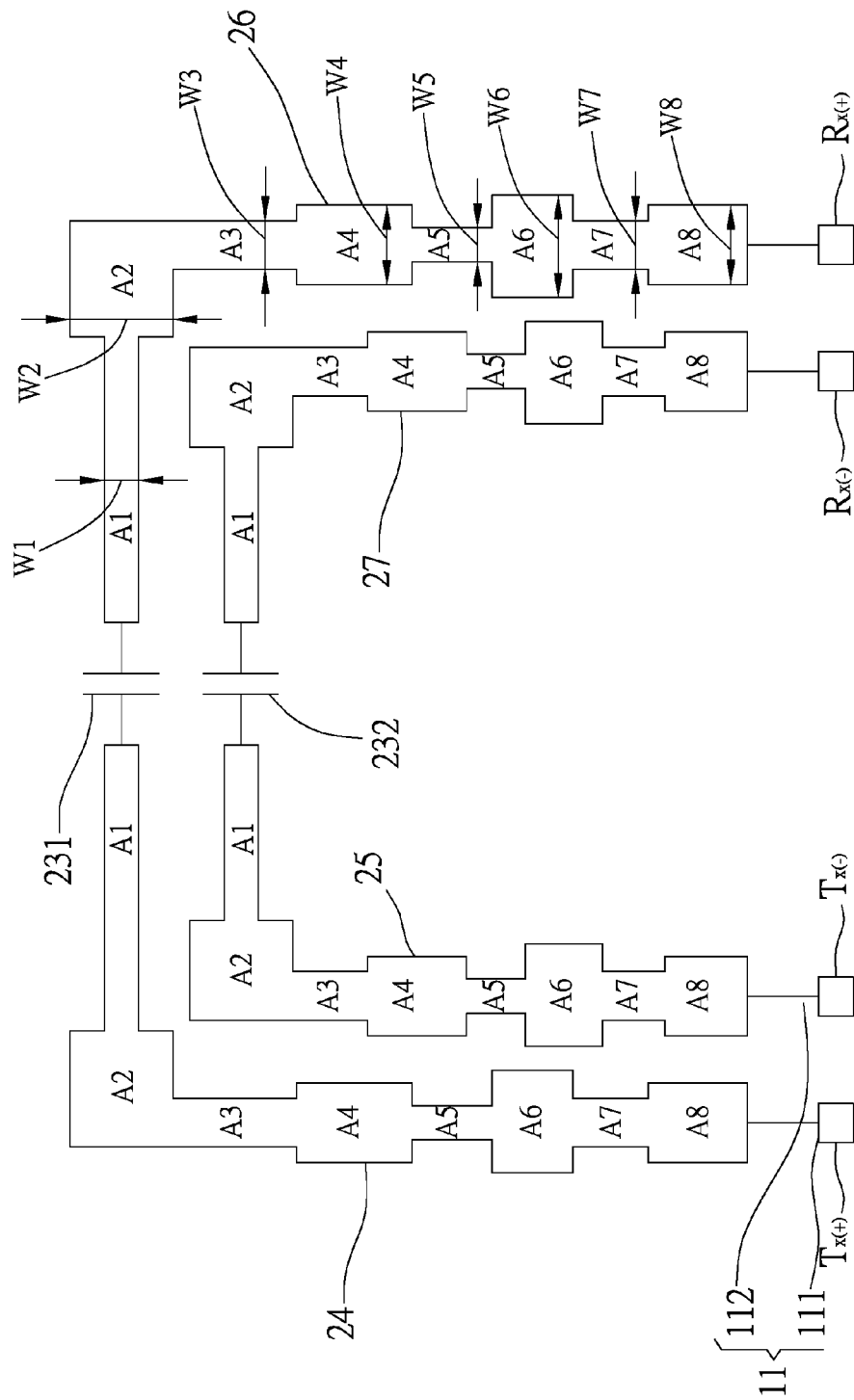
FIG. 13 is a circuit of a seventh embodiment of the present invention.

The circuit of the band circuit of the seventh embodiment of the present invention is shown in FIG. 13, which has roughly the same structure of that of the sixth embodiment, except that, in the seventh embodiment, the wire segments of each of the signal wires 24-27 includes a first wire segment A1, a second wire segment A2, a third wire segment A3, a fourth wire segment A4, a fifth wire segment A5, a sixth wire segment A6, a seventh wire segment A7, and an eighth wire segment A. These wire segments have the following relation:

$W2>W4>W3>W1$
$W1=W5$; $W2=W6$; $W3=W7$; $W4=W8$

Where, W1-W8 are, respectively, a diameter of the first to the eighth wire segments A1-A8. In other words, each of the signal wires 24-27 has four different diameters (i.e., the values of W1, W2, W3, and W4) for different wire segments, and these four different diameters are repeated for at least once along the relevant signal wires 24-27.

Whereby, signals out of the bandwidth could be also greatly attenuated or filtered out.

In the aforementioned fifth to seventh embodiments, each of the wires 24-27 has at least two different diameters for the wire segments, and the at least two different diameters are repeated for at least once along the relevant wires 24-27. In practice, each of the wires 24-27 could have more than four different diameters for the wire segments thereof, and these diameters could be repeated for at least once. Also, in the first to the third, and the fifth to the seventh embodiments, the width of each end of the capacitors is less than or equal to the diameter of the wire segment connected thereto; the width of the pin butt of the signal pins is less than or equal to the diameter of the wire segment connected thereto.

It must be pointed out that the embodiments described above are only some preferred embodiments of the present invention. All equivalent structures which employ the concepts disclosed in this specification and the appended claims should fall within the scope of the present invention.

What is claimed is:

1. A probe card capable of transmitting high-frequency signals provided by a device under test (DUT), wherein the DUT includes an output pin group and an input pin group for sending and receiving the high-frequency signals respectively, the probe card comprising:
   a first signal pin group, which is made of a conductive material, for contacting the output pin group of the DUT;
   a second signal pin group, which is made of a conductive material, for contacting the input pin group of the DUT; and
   a band circuit, which is electrically connected to the first signal pin group and the second signal pin group to allow signals within a bandwidth to pass therethrough, and signals beyond the bandwidth are attenuated or filtered out; wherein, a lowest frequency of the bandwidth is 0 Hz; the high-frequency signals for transmission are within the bandwidth; the band circuit comprises at least a capacitor, a first signal wire group, and a second signal wire group, wherein the first signal wire group and the second signal wire group are respectively connected to two ends of the capacitor; the first signal wire group and the second signal wire group are made of a conductive material, and are respectively electrically connected to the first signal pin group and the second signal pin group; the first signal wire group and the second signal wire group respectively have at least one conductive wire, wherein each of the conductive wires comprises a plurality of wire segments, and each two connected wire segments have different diameters;
   whereby, once the output pin group of the DUT sends the high-frequency signals, the high-frequency signals are transmitted to the band circuit through the first signal pin group, and then transmitted to the input pin group of the DUT through the second signal pin group.

2. The probe card of claim 1, wherein the two ends of the capacitor are respectively electrically connected to one of the wire segments of one of the at least one conductive wire of the first signal wire group and one of the wire segments of one of the at least one conductive wire of the second signal wire group; a width of each of the ends of the capacitor is less than or equal to a diameter of the wire segment connected thereto.

3. The probe card of claim 1, wherein the first signal pin group and the second signal pin group respectively have at least one signal pin, and each of the signal pins has a pin tip and a pin butt, wherein the pin tips of the signal pins are adapted to respectively contact the output pin group and the input pin group of the DUT, while the pin butts of the signal pins are respectively electrically connected to one of the wire segments of one of the at least one conductive wire of the first signal wire group and one of the wire segments of one of the at least one conductive wire of the second signal wire group; a width of each of the pin butts of the signal pins is less than or equal to a diameter of the wire segment connected thereto.

4. The probe card of claim 1, wherein the wire segments of each of the wires comprises a first wire segment and a second wire segment; the first wire segment electrically connects the capacitor and the second wire segment; the first wire segment and the second wire segment have the following relation:
   $W1 < W2$;
   where $W1$ is a diameter of the first wire segment; $W2$ is a diameter of the second wire segment.

5. The probe card of claim 4, wherein each of the wires further comprises a third wire segment; the second wire segment electrically connects the first wire segment and the third wire segment, and is located between the first wire segment and the third wire segment; these wire segments have the following relation:
   $W3 > W1$, and $W3 \neq W2$;
   where $W3$ is a diameter of the third wire segment.

6. The probe card of claim 5, wherein each of the conductive wires satisfies the following condition:
   $W1 = W3$.

7. The probe card of claim 5, wherein each of the conductive wires further comprises a fourth wire segment; the third wire segment electrically connects the second wire segment and the fourth wire segment; these wire segments have the following relation:
   $W4 > W1$, and $W4 \neq W3$;
   where, $W4$ is a diameter of the fourth wire segment.

8. The probe card of claim 7, wherein each of the conductive wires satisfies the following condition:
   $W1 = W3$, $W2 = W4$.

9. The probe card of claim 7, wherein each of the conductive wires satisfies the following condition:
   $W1 = W4$.

10. The probe card of claim 1, wherein each of the conductive wires has at least two different diameters for different wire segments thereof, and the at least two different diameters are repeated for at least once along the conductive wire.

11. The probe card of claim 1, wherein the wire segments of each of the conductive wires comprises a first wire segment and a second wire segment; the first wire segment electrically connects the capacitor and the second wire segment; the first wire segment and the second wire segment have the following relation:
   $W2 \leq 0.9(W1)$;
   where $W1$ is a diameter of the first wire segment; $W2$ is a diameter of the second wire segment.

12. The probe card of claim 1, wherein the output pin group of the DUT includes a positive output pin and a negative output pin, and the input pin group of the DUT includes a positive input pin and a negative input pin; the first signal pin group includes a first positive signal pin and a first negative signal pin for contacting the positive output pin and the negative output pin respectively; the second signal pin group includes a second positive signal pin and a second negative signal pin for contacting the positive input pin and the negative input pin respectively, a number of the at least one capacitor of the band circuit is two, which are defined as a first capacitor and a second capacitor; a number of the at least one conductive wire of the first signal wire group is two, which are defined as a first positive signal wire and a first negative signal wire; two ends of the first positive signal wire are connected to the first capacitor and the first positive signal pin respectively; two ends of the first negative wire are connected to the second capacitor and the first negative signal pin respectively; a number of the at least one conductive wire of the second signal wire group is two, and the two conductive wires are defined as a second positive signal wire and a second negative signal wire; two ends of the second positive signal wire are connected to the first capacitor and the second positive signal pin respectively; two ends of the second negative signal wire is connected to the second capacitor and the second negative signal pin respectively.

13. The probe card of claim 1, wherein the band circuit further includes a circuit substrate connected to the first signal pin group and the second signal pin group, and the first signal wire group and the second signal wire group are embedded in the circuit substrate.

14. The probe card of claim 1, wherein the band circuit further includes a circuit substrate and a carrier substrate electrically connected to each other, wherein a circuit layout is provided on the circuit substrate; the carrier substrate is connected to the first signal pin group and the second signal pin group, and the first signal wire group and the second signal wire group are embedded in the carrier substrate.

15. The probe card of claim 1, wherein the band circuit further includes a circuit substrate and a carrier substrate electrically connected to each other, wherein a circuit layout is provided on the circuit substrate; the carrier substrate is connected to the first signal pin group and the second signal pin group; a part of the first signal wire group and a part of the second signal wire group are embedded in the circuit substrate, and a part of the first signal wire group and a part of the second signal wire group are embedded in the carrier substrate.

16. The probe card of claim 12, wherein the capacitor is an embedded capacitor embedded in the circuit substrate, or is a stand-alone component provided on the circuit substrate.

17. The probe card of claim 15, wherein the capacitor is a stand-alone component provided on or embedded in the circuit substrate.

18. The probe card of claim 14, wherein the capacitor is an embedded capacitor embedded in or on the carrier substrate.

19. The probe card of claim 15, wherein the capacitor is a stand-alone component provided in or on the carrier substrate.

* * * * *